United States Patent
Yamamoto et al.

(10) Patent No.: US 12,068,165 B2
(45) Date of Patent: Aug. 20, 2024

(54) METHOD FOR MANUFACTURING SEMICONDUCTOR DEVICE AND APPARATUS FOR MANUFACTURING SEMICONDUCTOR DEVICE

(71) Applicant: OKAMOTO MACHINE TOOL WORKS, LTD., Gunma (JP)

(72) Inventors: Eiichi Yamamoto, Gunma (JP); Tsubasa Bando, Gunma (JP); Takahiko Mitsui, Gunma (JP)

(73) Assignee: OKAMOTO MACHINE TOOL WORKS, LTD., Gunma (JP)

( * ) Notice: Subject to any disclaimer, the term of this patent is extended or adjusted under 35 U.S.C. 154(b) by 389 days.

(21) Appl. No.: 17/677,547

(22) Filed: Feb. 22, 2022

(65) Prior Publication Data

US 2022/0293425 A1    Sep. 15, 2022

(30) Foreign Application Priority Data

Mar. 11, 2021 (JP) .................. 2021-039546

(51) Int. Cl.
*H01L 21/304* (2006.01)
*B24B 9/06* (2006.01)
*H01L 21/66* (2006.01)

(52) U.S. Cl.
CPC ............ *H01L 21/304* (2013.01); *B24B 9/065* (2013.01); *H01L 22/20* (2013.01)

(58) Field of Classification Search
CPC ....... B24B 53/04; B24B 53/053; B24B 53/06; B24B 53/062; B24B 9/02; B24B 9/06;
(Continued)

(56) References Cited

U.S. PATENT DOCUMENTS 4,344,260 A * 8/1982 Ogiwara ................. B24B 9/065
257/E21.237
4,907,370 A * 3/1990 Tabata .................... B24B 53/12
451/72

(Continued)

FOREIGN PATENT DOCUMENTS

JP          9-216152 A     8/1997
JP        2009-39808 A     2/2009
(Continued)

*Primary Examiner* — Joel D Crandall
(74) *Attorney, Agent, or Firm* — RANKIN, HILL & CLARK LLP (57) ABSTRACT

There is provided a method for manufacturing a semiconductor device, including: attracting a semiconductor device wafer by a chuck mechanism and rotating the semiconductor device wafer horizontally; rotating a rotary blade horizontally by a vertical spindle to which ultrasonic waves are applied; trimming an outer peripheral end portion of the semiconductor device wafer that is horizontally rotating by the rotary blade that is horizontally rotating, to form a groove in the outer peripheral end portion; correcting a tip shape of the rotary blade that is horizontally rotating by a blade-forming grinding wheel during the trimming; and grinding one main surface of the semiconductor device wafer that is horizontally rotating by a cup grinding wheel that is horizontally rotating after the trimming.

6 Claims, 5 Drawing Sheets

(58) Field of Classification Search
CPC ....... B24B 9/065; B24B 9/107; H01L 21/304; H01L 22/20
See application file for complete search history.

(56) References Cited

U.S. PATENT DOCUMENTS

| | | | | |
|---|---|---|---|---|
| 5,658,189 | A * | 8/1997 | Kagamida | B24B 41/02 451/194 |
| 6,110,391 | A * | 8/2000 | Takei | H01L 21/76251 216/33 |
| 6,594,847 | B1 * | 7/2003 | Krusell | B08B 3/10 15/103.5 |
| 8,127,391 | B2 * | 3/2012 | Nonomura | H01L 21/67046 15/88.2 |
| 8,286,293 | B2 * | 10/2012 | Nishiyama | H01L 21/67046 15/88.2 |
| 9,748,090 | B2 * | 8/2017 | Hirasawa | H01L 21/02057 |
| 10,128,103 | B2 * | 11/2018 | Chang | H01L 21/6704 |
| 2004/0000326 | A1 * | 1/2004 | Ziemins | B08B 1/32 257/E21.228 |
| 2004/0185751 | A1 * | 9/2004 | Nakanishi | B24B 21/002 451/6 |
| 2007/0066192 | A1 * | 3/2007 | Kumahara | B24B 53/053 451/178 |
| 2007/0226924 | A1 * | 10/2007 | Hiraoka | B08B 1/32 15/88.2 |
| 2011/0165823 | A1 | 7/2011 | De et al. | |
| 2013/0115861 | A1 * | 5/2013 | Priewasser | B24B 7/228 451/54 |
| 2013/0264584 | A1 * | 10/2013 | Okita | H01L 29/1608 257/77 |
| 2020/0066507 | A1 | 2/2020 | Yamamoto et al. | |

FOREIGN PATENT DOCUMENTS

| | | |
|---|---|---|
| JP | 2011-142201 A | 7/2011 |
| JP | 2020-31106 A | 2/2020 |

* cited by examiner

METHOD FOR MANUFACTURING SEMICONDUCTOR DEVICE AND APPARATUS FOR MANUFACTURING SEMICONDUCTOR DEVICE

CROSS-REFERENCE TO RELATED APPLICATION

This application claims priority from Japanese Patent Application No. 2021-039546 filed with the Japan Patent Office on Mar. 11, 2021, the entire content of which is hereby incorporated by reference.

BACKGROUND

1. Technical Field

The present disclosure relates to a method for manufacturing a semiconductor device and an apparatus for manufacturing the semiconductor device.

2. Related Art

In manufacturing the semiconductor device, it is required to package a thinner semiconductor device wafer. Thinning of the semiconductor device wafer is performed by grinding processing using a fixed abrasive grain grinding wheel. In a step of thinning the semiconductor device wafer, if chipping occurs at a wafer edge, there arises a problem that a yield of the semiconductor device chip is lowered. Therefore, in order to suppress chipping of the semiconductor device wafer, it is known to trim (chamfer) the wafer edge before grinding processing for thinning.

For example, JP-A-2009-039808 discloses that edge grinding processing (chamfering processing) of a semiconductor substrate is performed using a cup wheel type diamond grinding wheel. In JP-A-2009-039808, a horizontally rotating semiconductor substrate is edge ground using a horizontally rotating diamond grinding wheel. Specifically, the horizontally rotating diamond grinding wheel is lowered from above so that a vertical surface of an outer peripheral edge of the diamond grinding wheel overlaps a vertical surface of an outer peripheral edge of the semiconductor substrate, and grinding cut is made on an edge surface of the semiconductor substrate.

Further, for example, JP-A-2011-142201 discloses an edge grinding process of the semiconductor substrate using a diamond edge grinding wheel that rotates vertically about a horizontal axis. In the edge grinding process of JP-A-2011-142201, a vertically rotating edge grinding wheel is lowered to reduce a thickness of the outer peripheral edge of the horizontally rotating semiconductor substrate to a desired thickness.

Further, JP-A-09-216152 discloses an end grinding device that vertically rotates a diamond wheel by a spindle disposed in a Y axis direction (a horizontal direction) and brings an outer peripheral surface of the diamond wheel into contact with an outer peripheral portion of a horizontally rotating semiconductor wafer to grind the semiconductor wafer.

Further, JP-A-2020-031106 discloses a technique in which the semiconductor device wafer is horizontally rotated by a chuck mechanism and a rotary blade is horizontally rotated by a vertical spindle to which ultrasonic waves are applied, so that a peripheral side surface of the semiconductor device wafer is trimmed by the rotary blade.

In addition, it is known that a back grind tape (BG tape) is attached to a device surface of the semiconductor device wafer as a grinding protection layer, and a wafer support system (WSS) which is a method of forming a support wafer on the device surface of the semiconductor device wafer via a resin is known.

SUMMARY

A method for manufacturing a semiconductor device according to embodiments of the present disclosure is configured to include: attracting a semiconductor device wafer by a chuck mechanism and rotating the semiconductor device wafer horizontally; rotating a rotary blade horizontally by a vertical spindle to which ultrasonic waves are applied; trimming an outer peripheral end portion of the semiconductor device wafer that is horizontally rotating by the rotary blade that is horizontally rotating, to form a groove in the outer peripheral end portion; correcting a tip shape of the rotary blade that is horizontally rotating by a blade-forming grinding wheel during the trimming; and grinding one main surface of the semiconductor device wafer that is horizontally rotating by a cup grinding wheel that is horizontally rotating after the trimming.

BRIEF DESCRIPTION OF THE DRAWINGS

FIGS. 5A to 5D are diagrams illustrating a method for manufacturing the semiconductor device according to the embodiment of the present disclosure.

FIGS. 6A and 6B are diagrams illustrating the vicinity of a trimming surface according to the embodiment of the present disclosure, FIGS. 7A to 7D are diagrams illustrating the method for manufacturing the semiconductor device according to another embodiment of the present disclosure.

DETAILED DESCRIPTION

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

As described above, in the field of semiconductor devices, further thinning of semiconductor device wafers is required, and in order to achieve this, highly accurate trimming technique for preventing chipping of the semiconductor device wafer is required.

However, the above-mentioned related art has a problem to be improved in order to achieve a highly accurate and highly efficient edge trimming step that suppresses chipping of the semiconductor device wafer.

Specifically, a method of trimming an edge by a cup wheel type diamond grinding wheel as in the above-mentioned related art has a problem that a processing speed is slow and productivity is low. Further, there is a disadvantage that verticality of a trimming bottom surface is lost due to wear of the cup wheel type diamond grinding wheel, and the trimming bottom surface is tapered.

Further, in the method of trimming the edge by pressing a vertically rotating diamond blade against the edge of the horizontally rotating semiconductor device wafer, since the diamond blade and the semiconductor device wafer are in line contact with each other, there is a disadvantage that a shear stress on the semiconductor device wafer is large.

Therefore, in a method of forming a support wafer on a device surface of the semiconductor device wafer by WSS via a resin, when WSS bonding is not perfect, the shear stress of the diamond blade may create a new defect in the semiconductor device wafer and the WSS.

Further, in a method of processing the edge of the device surface of the semiconductor device wafer with the diamond blade, since a BG tape is attached or the support wafer is formed by the WSS in a state where a step is formed on an outer periphery of the device surface, a thickness of the semiconductor device wafer tends to vary in a thinning step.

Further, in the above-mentioned method of trimming the device surface of the semiconductor device wafer, since a semiconductor wafer such as silicon (Si) under a metal and an insulating film must be processed via the metal and the insulating film which are difficult to be processed, wear of the diamond blade increases.

Further, in the above-mentioned method of trimming the device surface of the semiconductor device wafer, since dust and contamination scattered on the device surface are likely to adhere to the device surface, there is a problem that precision cleaning or the like for removing the dust and contamination is required, and as a result, the process cost increases.

Further, as in the related art disclosed in JP-A-2020-031106, by the method of trimming a peripheral side surface of the horizontally rotating semiconductor device wafer by using a rotary blade horizontally rotated by a vertical spindle to which ultrasonic waves are applied, trimming can be performed at high speed and with high accuracy. However, in order to put it into practical use as a mass production technology, a high yield processing technology that can stably obtain highly accurate trimming shape and trim surface properties with high quality is required.

The present disclosure has been made in view of the above circumstances, and an object of the present disclosure is to provide a method and an apparatus for manufacturing a semiconductor device, in which stable trimming shape and trim surface properties can be obtained, a highly functional semiconductor device wafer can be processed with a high yield, and the productivity is high.

A method for manufacturing a semiconductor device according to the present disclosure includes: attracting a semiconductor device wafer by a chuck mechanism and rotating the semiconductor device wafer horizontally; rotating a rotary blade horizontally by a vertical spindle to which ultrasonic waves are applied; trimming an outer peripheral end portion of the semiconductor device wafer that is horizontally rotating by the rotary blade that is horizontally rotating, to form a groove in the outer peripheral end portion; correcting a tip shape of the rotary blade that is horizontally rotating by a blade-forming grinding wheel during the trimming; and grinding one main surface of the semiconductor device wafer that is horizontally rotating by a cup grinding wheel that is horizontally rotating after the trimming.

Moreover, an apparatus for manufacturing a semiconductor device according to the present disclosure includes: a chuck mechanism; a vertical spindle; an ultrasonic vibration device; a rotary blade; and a blade-forming grinding wheel. The chuck mechanism is configured to attract a semiconductor device wafer and rotate the semiconductor device wafer horizontally; the vertical spindle is configured to rotate the rotary blade horizontally; the ultrasonic vibration device is configured to apply ultrasonic waves to the vertical spindle; the rotary blade is configured to, while being rotated horizontally by the vertical spindle to which the ultrasonic waves are applied, trim an outer peripheral end portion of the semiconductor device wafer, that is attracted by the chuck mechanism and rotates horizontally, to form a groove in the outer peripheral end portion; and the blade-forming grinding wheel is configured to correct a tip shape of the rotary blade by contacting a tip of the rotary blade that is horizontally rotating.

The method for manufacturing the semiconductor device according to the present disclosure includes: attracting the semiconductor device wafer by the chuck mechanism and rotating the semiconductor device wafer horizontally; rotating the rotary blade horizontally by the vertical spindle to which the ultrasonic waves are applied; trimming the outer peripheral end portion of the semiconductor device wafer that is horizontally rotating by the rotary blade that is horizontally rotating, to form the groove in the outer peripheral end portion; correcting the tip shape of the rotary blade that is horizontally rotating by the blade-forming grinding wheel during the trimming; and grinding the one main surface of the semiconductor device wafer that is horizontally rotating by the cup grinding wheel that is horizontally rotating after the trimming. By these steps, the outer peripheral end portion of the semiconductor device wafer can be trimmed without being affected by various coating films such as a metal film or an insulating film formed on a surface of the device surface of the semiconductor device wafer. In the edge trimming step, the rotary blade is horizontally rotated by the vertical spindle to which the ultrasonic waves are applied, so that trimming can be performed at high speed and with high accuracy. Then, in the edge trimming step, the tip shape of the rotary blade that is horizontally rotating is corrected to a suitable shape by the blade-forming grinding wheel. Thus, the stable trimming shape and trim surface properties can be obtained for the semiconductor device wafer, and a highly functional semiconductor device wafer can be processed with a high yield. That is, excellent productivity that cannot be obtained by the related art can be obtained. Specifically, semiconductor device wafers having an ultra thin thickness of 20 µm or less can be mass produced with a high yield.

Moreover, the method for manufacturing the semiconductor device according to the present disclosure may further include: during the trimming, imaging a shape of the groove; analyzing the shape of the groove based on captured image data; and correcting the tip shape of the rotary blade by the blade-forming grinding wheel based on the analyzed shape of the groove. Thus, a highly accurate and precise trimming shape can be obtained by continuous and efficient trimming processing.

Moreover, the method for manufacturing the semiconductor device according to the present disclosure may further include: during the trimming, projecting parallel light onto the groove; and analyzing the shape of the groove based on a shape of a shadow of the parallel light. Thus, the shape of the trimmed groove of the semiconductor device wafer can be detected efficiently and with high accuracy, and the groove having highly accurate and stable shape and surface properties can be processed with high efficiency.

Moreover, the method for manufacturing the semiconductor device according to the present disclosure may further include correcting the tip shape of the rotary blade while adjusting a support angle of the blade-forming grinding wheel. Thus, the tip shape of the rotary blade can always be maintained in a suitable state, so that highly accurate trimming processing can be performed continuously and efficiently. Specifically, a trimming surface inclined at a suitable angle can be formed at the outer peripheral end portion of the semiconductor device wafer.

Moreover, the apparatus for manufacturing the semiconductor device according to the present disclosure includes: the chuck mechanism; the vertical spindle; the ultrasonic vibration device; the rotary blade; and the blade-forming grinding wheel. The chuck mechanism is configured to attract the semiconductor device wafer and rotate the semiconductor device wafer horizontally; the vertical spindle is configured to rotate the rotary blade horizontally; the ultrasonic vibration device is configured to apply the ultrasonic waves to the vertical spindle; the rotary blade is configured to, while being rotated horizontally by the vertical spindle to which the ultrasonic waves are applied, trim the outer peripheral end portion of the semiconductor device wafer, that is attracted by the chuck mechanism and rotates horizontally, to form the groove in the outer peripheral end portion; and the blade-forming grinding wheel is configured to correct the tip shape of the rotary blade by contacting the tip of the rotary blade that is horizontally rotating. With such a configuration, the tip shape of the rotary blade for trimming the outer peripheral end portion of the semiconductor device wafer is always maintained in a suitable state, and highly accurate and highly efficient trimming processing can be continuously performed. Therefore, high yield manufacturing of highly functional and state-of-the-art semiconductor device wafers is achieved, and the productivity is improved.

Moreover, the apparatus for manufacturing the semiconductor device according to the present disclosure may further include an observation unit that images a shape of the groove and analyzes the shape of the groove based on captured image data, and the blade-forming grinding wheel may correct the tip shape of the rotary blade based on the analyzed shape of the groove. With such a configuration, it is possible to always accurately grasp a trimming state of the outer peripheral end portion of the semiconductor device wafer. Therefore, the tip shape can be accurately corrected by the blade-forming grinding wheel so that the tip shape of the rotary blade is always in a suitable state. As a result, highly accurate and highly efficient trimming processing is continuously performed, and a yield of semiconductor device wafer manufacturing is increased.

Hereinafter, the method and the apparatus for manufacturing the semiconductor device according to an embodiment of the present disclosure will be described in detail with reference to the drawings.

Figure 1:
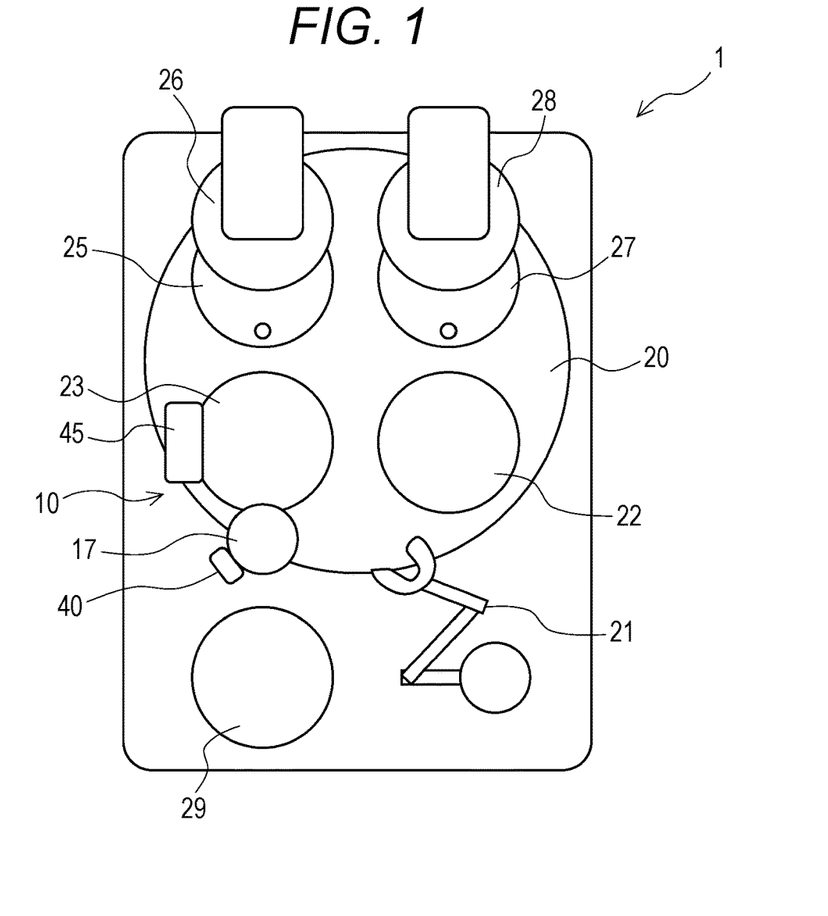
FIG. 1 is a plan view illustrating an apparatus for manufacturing a semiconductor device according to an embodiment of the present disclosure.

FIG. 1 is a plan view illustrating an apparatus 1 for manufacturing a semiconductor device according to the embodiment of the present disclosure, and illustrates a schematic configuration of a fully automatic grinding apparatus incorporating an edge trimming device 10.

Figure 2:
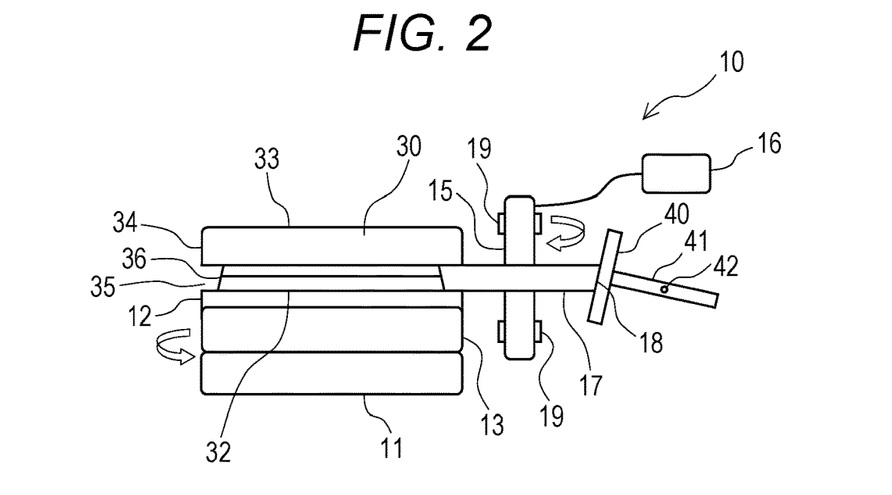
FIG. 2 is a front view illustrating an edge trimming device of the apparatus for manufacturing the semiconductor device according to the embodiment of the present disclosure.

The manufacturing apparatus 1 illustrated in FIG. 1 is an apparatus that automatically performs a series of steps from a chucking step to an edge trimming step, a thinning step, and a cleaning step of a semiconductor device wafer 30 (see FIG. 2).

The manufacturing apparatus 1 includes a transfer robot 21 that transfers the semiconductor device wafer 30, and also includes a standby table 22, an ultrasonic trimming table 23, a rough grinding table 25, a finish grinding table 27, and a cleaning unit 29 that perform respective steps.

Then, the manufacturing apparatus 1 includes a 90 degree index feed table 20 for index feeding the semiconductor device wafer 30 by 90 degrees on the standby table 22, the ultrasonic trimming table 23, the rough grinding table 25, and the finish grinding table 27.

The standby table 22 is a table that performs the chucking step of the semiconductor device wafer 30. The semiconductor device wafer 30 to be processed is first transferred to the standby table 22 by the transfer robot 21. Then, the chucking step of the semiconductor device wafer 30 is performed on the standby table 22.

The ultrasonic trimming table 23 is a table that performs the edge trimming step of the semiconductor device wafer 30. After the chucking step on the standby table 22, the semiconductor device wafer 30 is index fed clockwise by 90 degrees on the 90 degree index feed table 20. Then, the edge trimming step of the semiconductor device wafer 30 is performed on the ultrasonic trimming table 23. Specifically, a part of an outer peripheral end portion 34 (see FIG. 2) of the semiconductor device wafer 30 is ground by a rotary blade 17 of the edge trimming device 10 that horizontally rotates with the ultrasonic waves being applied.

Further, the manufacturing apparatus 1 includes an imaging apparatus 45 as an observation unit for accurately imaging and analyzing the trimming shape of the semiconductor device wafer 30. The imaging apparatus 45 images the vicinity of the outer peripheral end portion 34 of the semiconductor device wafer 30, and analyzes shape information of the groove 35 (see FIG. 2) formed in the outer peripheral end portion 34 by the edge trimming step on the basis of image data 49 (see FIG. 4). Thus, highly accurate trimming is achieved.

The rough grinding table 25 and the finish grinding table 27 are tables for performing the thinning step of the semiconductor device wafer 30. Above the rough grinding table 25, a rough grinding head 26 for rough grinding an upper surface of the semiconductor device wafer 30 is provided. Above the finish grinding table 27, a finish grinding head 28 for finish grinding the upper surface of the semiconductor device wafer 30 is provided.

The semiconductor device wafer 30 for which the edge trimming step has been completed on the ultrasonic trimming table 23 is further index fed clockwise by 90 degrees by the 90 degree index feed table 20. Then, on the rough grinding table 25, rough grinding, that is, thinning by the rough grinding head 26 is performed.

Then, the semiconductor device wafer 30 roughly ground on the rough grinding table 25 is index fed to the finish grinding table 27 by the 90 degree index feed table 20, and is finish ground to a final thickness by the finish grinding head 28.

The semiconductor device wafer 30 for which the thinning step has been completed on the finish grinding table 27 is returned to the standby table 22 by the 90 degree index feed table 20, and then transferred to the cleaning unit 29 by the transfer robot 21. Then, in the cleaning unit 29, the cleaning step of cleaning the semiconductor device wafer 30 is performed.

The manufacturing apparatus 1 illustrated in FIG. 1 is only an example of the embodiment of the present disclosure. For example, only the edge trimming device 10 may be separated from the manufacturing apparatus 1 illustrated in FIG. 1 to be a single fully automatic trimming device.

Further, for example, the edge trimming device 10 may be provided at a portion where the cleaning unit 29 is disposed in FIG. 1, and may be separated from a grinding stage including the rough grinding table 25 and the finish grinding table 27. In that case, the manufacturing apparatus 1 may be configured as an automatic grinding apparatus to which the edge trimming device 10 is attached.

FIG. 2 is a front view illustrating a schematic configuration of the edge trimming device 10.

As illustrated in FIG. 2, the edge trimming device 10 is a device for trimming the outer peripheral end portion 34 of the semiconductor device wafer 30.

The edge trimming device 10 includes a vacuum chuck 11 that supports and horizontally rotates the semiconductor device wafer 30, the rotary blade 17 that grinds the outer peripheral end portion 34 of the semiconductor device wafer 30, a vertical spindle 15 that supports the rotary blade 17, and an ultrasonic vibration device 16 that applies the ultrasonic waves to the vertical spindle 15.

The vacuum chuck 11 constitutes a chuck mechanism for chucking the semiconductor device wafer 30. The vacuum chuck 11 is provided to be horizontally rotatable so that its rotation axis is substantially vertical. The semiconductor device wafer 30 is attached to an upper surface of the vacuum chuck 11 via a holding layer formed by a support substrate 13 and the like, and the semiconductor device wafer 30 horizontally rotates together with the chuck mechanism including the vacuum chuck 11 and the like.

The rotary blade 17 is, for example, a diamond grinding wheel blade in which the diamond grinding wheel is fixed with a vitrified bond. The rotary blade 17 is provided at a position where a central portion thereof is supported by the vertical spindle 15, and rotates horizontally, and a tip, that is, an outer peripheral grinding wheel surface 18 of the rotary blade 17 is provided at a position where it can contact the outer peripheral end portion 34 of the semiconductor device wafer 30.

The vertical spindle 15 is a rotating shaft that supports the rotary blade 17. The vertical spindle 15 has a rotation axis extending in a vertical direction and is provided to be horizontally rotatable. When the vertical spindle 15 is rotationally driven by a drive device (not illustrated), the rotary blade 17 rotates horizontally.

The vertical spindle 15 and the rotary blade 17 are provided to be movable in a horizontal direction toward the semiconductor device wafer 30. Thus, the horizontally rotating rotary blade 17 is brought closer to the semiconductor device wafer 30 that is held by the vacuum chuck 11 and rotates horizontally, so that the outer peripheral grinding wheel surface 18 of the rotary blade 17 can be pressed against the outer peripheral end portion 34 of the semiconductor device wafer 30. Then, the outer peripheral end portion 34 of the semiconductor device wafer 30 is ground with high accuracy by the outer peripheral grinding wheel surface 18 of the rotary blade 17, so that it is possible to form a trimming surface 36 having a desired average depth D (see FIG. 4).

Note that in order to perform trimming by pressing the outer peripheral grinding wheel surface 18 of the horizontally rotating rotary blade 17 against the outer peripheral end portion 34 of the horizontally rotating semiconductor device wafer 30 as described above, the vacuum chuck 11 holding the semiconductor device wafer 30 may be movable horizontally.

Further, the rotary blade 17 or the vacuum chuck 11 may be movable in the up-down direction. Thus, trimming can be repeatedly performed by changing a position in the up-down direction of the rotary blade 17 with respect to the semiconductor device wafer 30. Then, the trimming surface 36 can be formed in a desired range in the up-down direction with respect to the outer peripheral end portion 34 of the semiconductor device wafer 30.

Further, the vertical spindle 15 is pivotally supported by bearings 19 above and below the rotary blade 17. Since the vertical spindle 15 is pivotally supported at upper and lower positions in this way, rotational runout of the rotary blade 17 is suppressed, rotational accuracy is improved, and accurate and precise trimming processing can be performed.

As the bearing 19, for example, a general mechanical bearing such as a ball bearing, a cylindrical roller bearing, or a conical roller bearing may be employed. Further, at least one of the bearings 19 provided above and below the rotary blade 17 may be an air bearing that forms an air film between the bearing 19 and the vertical spindle 15 and pivotally supports the vertical spindle 15 in a non-contact manner. Since the air bearing is used as the bearing 19, the rotary blade 17 is held with low friction and high accuracy and rotates at high speed. Therefore, the outer peripheral end portion 34 of the semiconductor device wafer 30 can be trimmed with high accuracy.

In particular, by employing the air bearing as the bearing 19 to be provided below the rotary blade 17, deterioration due to scattering of processing water can be suppressed, and life of the bearing 19 and the vertical spindle 15 can be extended.

The ultrasonic vibration device 16 is a device that applies the ultrasonic waves to the vertical spindle 15. When the ultrasonic waves are applied to the vertical spindle 15 by the ultrasonic vibration device 16, the ultrasonic waves are applied to the rotary blade 17, and the rotary blade 17 ultrasonically vibrates in a rotating radial direction. This makes it possible to trim the outer peripheral end portion 34 of the semiconductor device wafer 30 at high speed and with high accuracy. Further, since the ultrasonic waves are applied to the rotary blade 17, wear of the rotary blade 17 is reduced. Thus, collapse in the vicinity of the trimmed outer peripheral end portion 34 of the semiconductor device wafer 30 is suppressed.

The edge trimming device 10 is provided with a blade-forming grinding wheel 40 that corrects the tip shape of the rotary blade 17. The blade-forming grinding wheel 40 is, for example, a blade-forming diamond grinding wheel in which the diamond grinding wheel is fixed with the vitrified bond.

The blade-forming grinding wheel 40 is supported so that its inclination can be adjusted by an inclination adjusting mechanism 41. Specifically, a grinding wheel surface of the blade-forming grinding wheel 40, which is in contact with the tip of the rotary blade 17, can be adjusted from a substantially vertical state to an inclined state. That is, the blade-forming grinding wheel 40 is supported by the inclination adjusting mechanism 41 and is rotatable about the support shaft 42 of the inclination adjusting mechanism 41 extending in a substantially horizontal direction.

The grinding wheel surface of the blade-forming grinding wheel 40 comes into contact with the tip of the rotary blade 17 at a position away from the outer peripheral end portion 34 of the semiconductor device wafer 30, that is, the outer peripheral grinding wheel surface 18 of the rotary blade 17. Thus, in the edge trimming step of trimming the outer peripheral end portion 34 of the semiconductor device wafer 30, the tip of the rotary blade 17 that rotates horizontally contacts the grinding wheel surface of the blade-forming grinding wheel 40, to be corrected to a shape suitable for trimming. That is, in the edge trimming step, the tip of the rotary blade 17 that rotates horizontally is ground in contact with the grinding wheel surface of the blade-forming grinding wheel 40.

With such a configuration, the tip shape of the rotary blade 17 that trims the outer peripheral end portion 34 of the semiconductor device wafer 30 is always maintained in a suitable state, and highly accurate and highly efficient trimming processing can be continuously performed. Therefore, high yield manufacturing of highly functional and state-of-the-art semiconductor device wafer 30 is achieved, and the productivity is improved.

Figure 3:
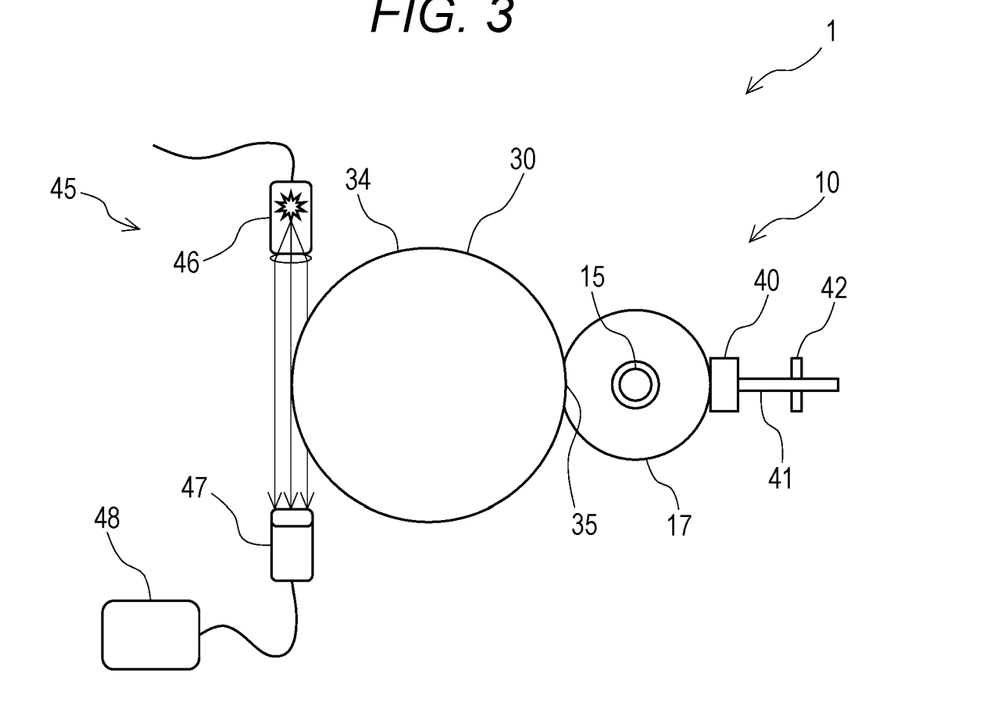
FIG. 3 is a plan view illustrating the edge trimming device of the apparatus for manufacturing the semiconductor device according to the embodiment of the present disclosure.

FIG. 3 is a plan view illustrating a schematic configuration of the edge trimming device 10.

As illustrated in FIG. 3, the edge trimming device 10 includes the imaging apparatus 45 as the observation unit for imaging and analyzing a shape of the trimmed groove 35. The imaging apparatus 45 includes a light source 46 that irradiates light, a light receiving element 47 that receives light from the light source 46, and an image analysis device 48 that analyzes the shape of the groove 35 on the basis of optical data of the light receiving element 47.

The light source 46 irradiates light for detecting the trimming state of the outer peripheral end portion 34 of the semiconductor device wafer 30. Specifically, the light source 46 is a parallel light source, and irradiates light so that a part of parallel light comes into contact with the vicinity of the outer peripheral end portion 34 of the semiconductor device wafer 30. That is, the light source 46 emits the parallel light in a substantially horizontal direction from the side of the semiconductor device wafer 30 toward the vicinity of the outer peripheral end portion 34 of the semiconductor device wafer 30.

The light receiving element 47 is provided to face the light source 46 so as to receive the light emitted from the light source 46. Therefore, the parallel light emitted from the light source 46 passes near the outer peripheral end portion 34 of the semiconductor device wafer 30 and is received by the light receiving element 47.

The light receiving element 47 is connected to the image analysis device 48. The image analysis device 48 analyzes the optical data received by the light receiving element 47. Specifically, the state of the outer peripheral end portion 34 of the semiconductor device wafer 30 is analyzed on the basis of the image data 49 (see FIG. 4).

Figure 4:
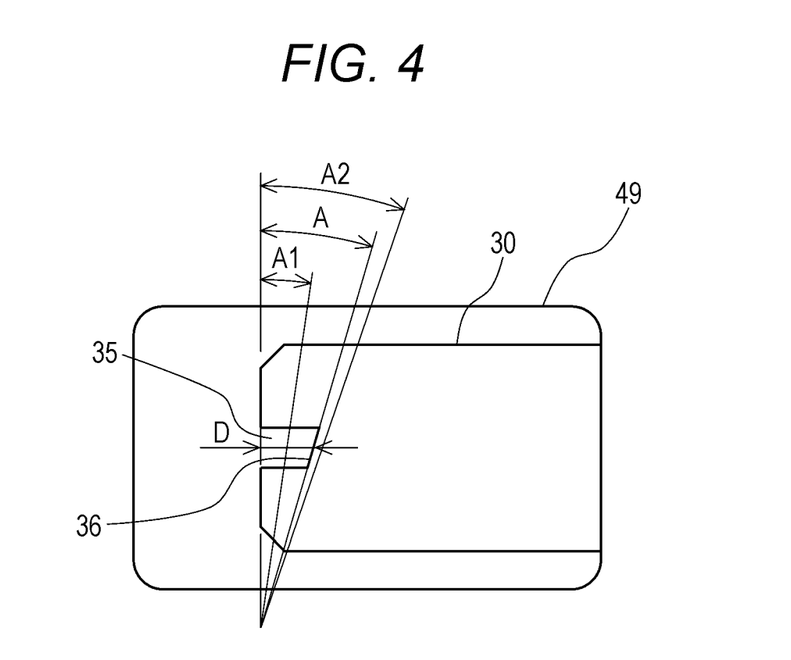
FIG. 4 is a diagram illustrating image data of an imaging apparatus of the apparatus for manufacturing the semiconductor device according to the embodiment of the present disclosure.

FIG. 4 is a diagram illustrating the image data 49 of the imaging apparatus 45 illustrated in FIG. 3.

As illustrated in FIG. 4, the imaging apparatus 45 accurately images the shape of the outer peripheral end portion 34 of the semiconductor device wafer 30. Then, the image analysis device 48 of the imaging apparatus 45 analyzes the shape of the groove 35 of the semiconductor device wafer 30 on the basis of the captured image data 49. The manufacturing apparatus 1 corrects the tip shape of the rotary blade 17 (see FIG. 2) by the blade-forming grinding wheel 40 (see FIG. 2) on the basis of analysis results of the shape of the groove 35 of the semiconductor device wafer 30 as imaged.

With such a configuration, the trimming state of the outer peripheral end portion 34 of the semiconductor device wafer 30 is always accurately grasped. Therefore, the tip shape of the rotary blade 17 can be accurately corrected by the blade-forming grinding wheel 40 so that the tip shape of the rotary blade 17 is always in a suitable state.

For example, the imaging apparatus 45 can continuously and accurately detect an average depth D of the groove 35 of the semiconductor device wafer 30, that is, an average depth D of the trimming surface 36 in the trimming step. Thus, the manufacturing apparatus 1 can form the groove 35 having an accurate average depth D.

Further, the imaging apparatus 45 can accurately detect an inclination of the trimming surface 36 of the groove 35, that is, an inclination angle A. Next, the imaging apparatus 45 analyzes (evaluates) whether the detected inclination angle A is within a suitable range. Thus, when the inclination angle A of the trimming surface 36 is smaller than a lower limit inclination angle A1 or larger than an upper limit inclination angle A2, the manufacturing apparatus 1 can correct the tip shape of the rotary blade 17, that is, an inclination of the outer peripheral grinding wheel surface 18 (see FIG. 2). The above description is an example of correcting the inclination of the outer peripheral grinding wheel surface 18 by using the inclination angle A of the trimming surface 36 as an object (evaluation index of the shape of the groove 35) to be analyzed on the basis of the captured image data.

Specifically, as illustrated in FIG. 2, in the manufacturing apparatus 1, the inclination adjusting mechanism 41 adjusts the support angle of the blade-forming grinding wheel 40, and the blade-forming grinding wheel 40 trims the tip shape of the rotary blade 17, so that the inclination of the outer peripheral grinding wheel surface 18 can be corrected to a suitable inclination.

Thus, the trimming step of the semiconductor device wafer 30 can be advanced with the inclination angle A of the trimming surface 36 as a suitable angle larger than the lower limit inclination angle A1 and smaller than the upper limit inclination angle A2 (see FIG. 4).

As described above, the edge trimming device 10 always maintains the tip shape of the rotary blade 17 at a suitable inclination angle A on the basis of shape information of the trimming surface 36 imaged and analyzed by the imaging apparatus 45, so that highly accurate trimming processing can be performed continuously and efficiently. As a result, the trimming surface 36 inclined at a suitable angle can be formed in the outer peripheral end portion 34 of the semiconductor device wafer 30.

Next, the method for manufacturing the semiconductor device according to the embodiment of the present disclosure will be described in detail with reference to FIGS. 5A to 5D, FIGS. 6A and 6B, and FIGS. 7A to 7D.

Figure 5A:
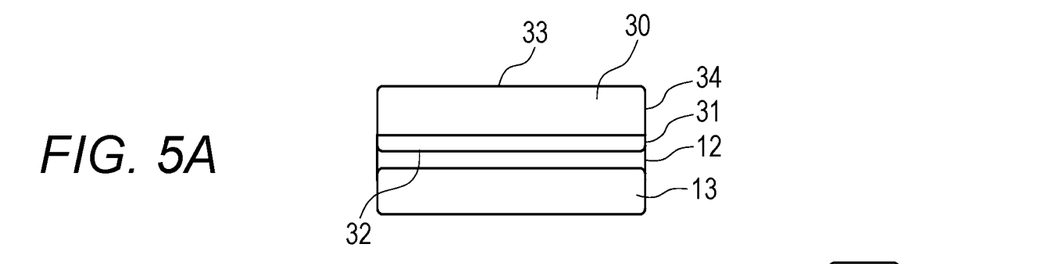
FIG. 5A is a diagram illustrating a state in which a semiconductor device wafer is prepared in a chucking step.
Figure 5B:
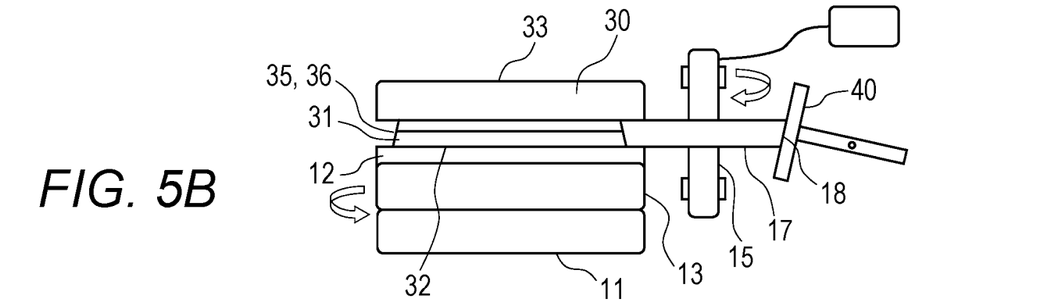
FIG. 5B is a diagram illustrating a state in which trimming is performed in an edge trimming step.
Figure 5C:
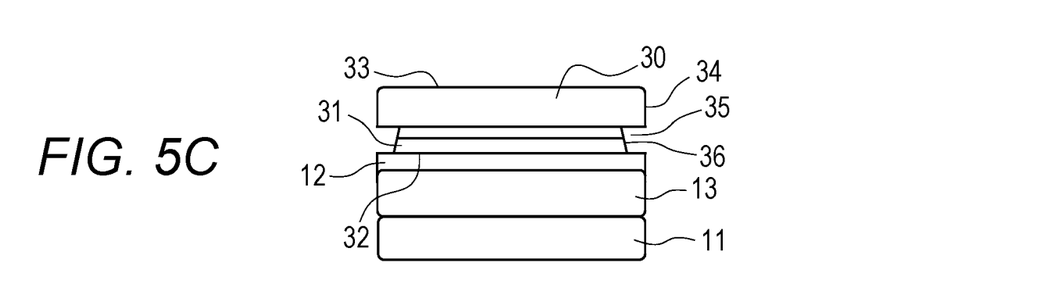
FIG. 5C is a diagram illustrating a state in which the edge trimming step is completed.
Figure 5D:
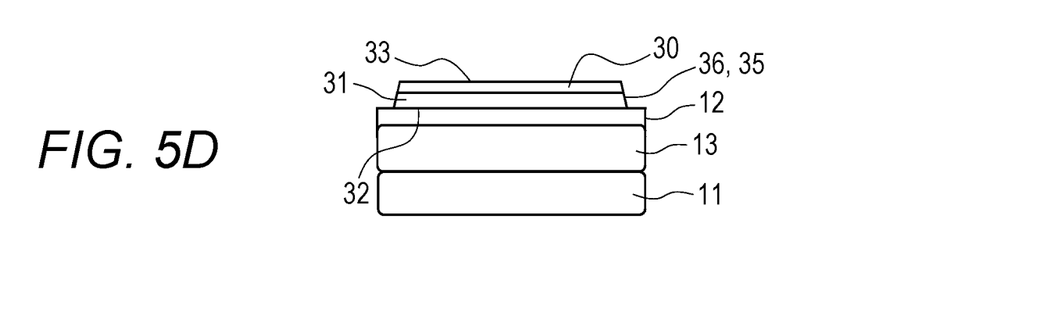
FIG. 5D is a diagram illustrating a state in which thinning is performed in a thinning step.

FIGS. 5A to 5D are diagrams illustrating the method for manufacturing the semiconductor device, FIG. 5A is a diagram illustrating a state in which the semiconductor device wafer 30 is prepared in the chucking step, FIG. 5B is a diagram illustrating a state in which the trimming is performed in the edge trimming step, FIG. 5C is a diagram illustrating a state in which the edge trimming step is completed, and FIG. 5D is a diagram illustrating a state in which thinning is performed in the thinning step.

As illustrated in FIG. 5A, the semiconductor device wafer 30 is a silicon wafer in which a semiconductor device layer 31 is formed, and its size is, for example, 300 mm in diameter and 775 μm in thickness.

In the chucking step, the support substrate 13 is bonded to a device surface 32 of the semiconductor device wafer 30 via a bonding resin layer 12 by a method of WSS. The bonding resin layer 12 is formed of, for example, a silicone-based resin, and its thickness is, for example, 40 μm. The support substrate 13 is, for example, a silicon-based or glass-based support wafer, and its thickness is, for example, 750 μm.

Next, as illustrated in FIG. 5B, the semiconductor device wafer 30 is held by the vacuum chuck 11 via the bonding resin layer 12 and the support substrate 13 with the device surface 32 facing down.

Then, the edge trimming step is performed on the ultrasonic trimming table 23 (see FIG. 1). In the edge trimming step, the semiconductor device wafer 30 is horizontally rotated by the vacuum chuck 11, and the outer peripheral grinding wheel surface 18 of the rotary blade 17 which is also horizontally rotated and to which the ultrasonic waves are applied is pressed against the outer peripheral end portion 34 of the semiconductor device wafer 30. Thus, the outer peripheral end portion 34 of the semiconductor device wafer 30 is trimmed, to form the groove 35.

Note that the rotary blade 17 may grind an upper portion of the bonding resin layer 12 together with the outer peripheral end portion 34. This makes it possible to enhance an effect of suppressing chipping of the semiconductor device wafer 30.

Here, a diameter of the rotary blade 17 is, for example, 100 mm, and the thickness of the outer peripheral grinding wheel surface 18 is, for example, 0.15 mm. A particle size of the diamond grinding wheel of the rotary blade 17 is preferably #240 to #8000, more preferably #1000 to #3000, and even more preferably #2000.

Further, a rotation speed of the rotary blade 17 in the edge trimming step is preferably 8000 to 12000 $min^{-1}$. The rotation speed of the semiconductor device wafer 30 is preferably 250 to 350 $min^{-1}$. A horizontal movement speed of the vertical spindle 15 is preferably 0.3 to 0.7 mm/min.

For example, by trimming for 3 minutes with the rotation speed of the rotary blade 17 of 10000 $min^{-1}$, the rotation speed of the semiconductor device wafer 30 of 300 $min^{-1}$, and the horizontal movement speed of the vertical spindle 15 of 0.5 mm/min, the trimming surface 36 is processed until the average depth D (see FIG. 4) from the outer peripheral end portion 34 is 1.5 mm. By trimming under these conditions, the semiconductor device wafer 30 having a surface roughness of 15 to 20 nm (Ra) can be obtained.

As described above, in the edge trimming step, the rotary blade 17 is horizontally rotated by the vertical spindle 15 to which the ultrasonic waves are applied. Therefore, the trimming is performed at a higher speed and with higher accuracy than the trimming by the cup wheel type diamond grinding wheel or the like of the related art. Further, since the ultrasonic waves are applied to the rotary blade 17 that rotates horizontally, the wear of the rotary blade 17 is reduced, and the collapse in the vicinity of the trimmed outer peripheral end portion 34 can be suppressed.

Here, frequency of the ultrasonic waves applied from the ultrasonic vibration device 16 to the vertical spindle 15 is, for example, 16 to 1000 kHz. Thus, the semiconductor device wafer 30 is suitably trimmed.

Further, the semiconductor device wafer 30 is trimmed by the horizontally rotating rotary blade 17 to which ultrasonic waves are applied, while being held by the vacuum chuck 11 with the device surface 32 facing down. Therefore, the device surface 32 is not contaminated in the edge trimming step. This eliminates the need for precision cleaning and achieves cost reduction of the semiconductor device. Further, the outer peripheral end portion 34 of the semiconductor device wafer 30 can be trimmed without being affected by various coating films such as a metal film or an insulating film formed on the surface of the device surface 32.

In the edge trimming step, the groove 35 is formed in the outer peripheral end portion 34 of the semiconductor device wafer 30, and the trimming surface 36 is formed inside the groove 35. Specifically, a thickness of the rotary blade 17 in the vicinity of the outer peripheral grinding wheel surface 18 is thinner than that of the semiconductor device wafer 30. Therefore, as illustrated in FIG. 5C, the trimming surface 36 is recessed from the outer peripheral end portion 34. As a result, the groove 35, which is a circumferential recess extending in a rotational direction of the semiconductor device wafer 30, is formed at the outer peripheral end portion 34.

Since the groove 35 is formed at the outer peripheral end portion 34 of the semiconductor device wafer 30 in the edge trimming step, it is also possible to reduce contamination on a back surface 33 of the semiconductor device wafer 30. Therefore, in the next thinning step, precise thinning processing can be performed.

In the edge trimming step, the imaging apparatus 45 (see FIG. 3) projects the parallel light onto the shape of the trimmed groove 35 of the semiconductor device wafer 30. The shape of the groove 35 is accurately analyzed on the basis of a shape of a shadow of the parallel light. Thus, the shape of the trimmed groove 35 of the semiconductor device wafer 30 can be analyzed efficiently and with high accuracy.

Then, when the shape of the trimmed groove 35 is analyzed by the imaging apparatus 45, the manufacturing apparatus 1 corrects the tip shape of the rotary blade 17 by the blade-forming grinding wheel 40 so that the shape of the groove 35 is within a specified value in the image data 49 (see FIG. 4), for example, so that the inclination angle A, which is the inclination of the trimming surface 36 of the groove 35, is within a suitable range. This enables continuous and efficient trimming processing, so that the highly accurate and precise trimming shape can be obtained. Therefore, the groove 35 having highly accurate and stable shape and surface properties can be processed with high efficiency.

After the edge trimming step is performed, the thinning step is sequentially performed on the rough grinding table 25 and the finish grinding table 27 (see FIG. 1). In the thinning step, as illustrated in FIG. 5D, the back surface 33 that is one main surface of the semiconductor device wafer 30 is ground and thinned by the cup grinding wheel (not illustrated).

The cup grinding wheel used in the thinning step is, for example, a cup wheel type grinding wheel using diamond abrasive grains having a particle size of #240 to #8000. In the rough grinding, grinding may be performed by making the abrasive grains of the cup grinding wheel larger and reducing the rotation speed, and in finish grinding, the grinding may be performed by making the abrasive grains of the cup grinding wheel smaller and increasing the rotation speed.

Since the thinning step is performed after the edge trimming step, thinning can be performed without variation in thickness, and the highly flat and thinned semiconductor device wafer 30 can be obtained. Further, as the chuck mechanism, a configuration for holding the device surface 32 can be used by attaching the support substrate 13 via the bonding resin layer 12, so that the thickness of the semiconductor device wafer 30 does not vary in the thinning step. Further, since the device surface 32 is protected by the support substrate 13, there is no problem of contamination and dust adhesion to the device surface 32.

Figure 6A:
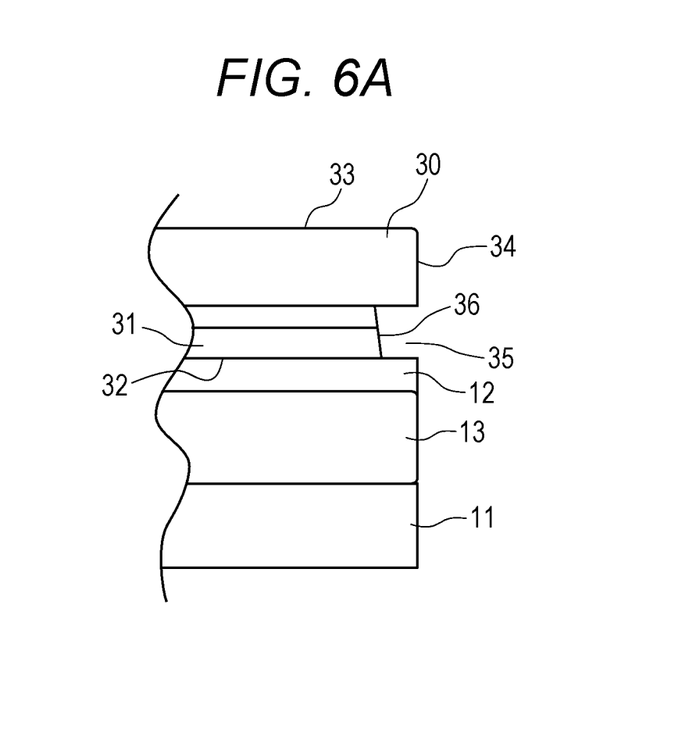
FIG. 6A is a diagram illustrating a state in which the edge trimming step is completed.
Figure 6B:
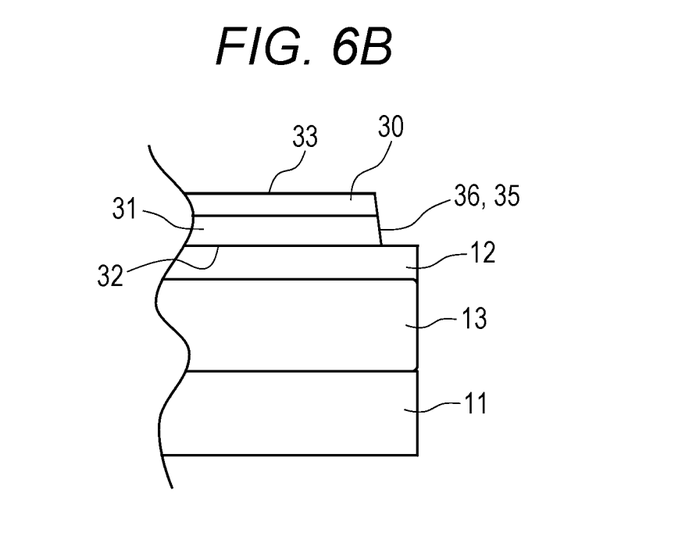
FIG. 6B is a diagram illustrating a state in which thinning is performed in the thinning step.

FIGS. 6A and 6B are diagrams illustrating the vicinity of the trimming surface 36 of the semiconductor device wafer 30. FIG. 6A is a diagram illustrating the state in which the edge trimming step is completed, and FIG. 6B is a diagram illustrating the state in which thinning is performed in the thinning step.

As illustrated in FIGS. 6A and 6B, a diameter of an upper portion of the trimming surface 36 of the groove 35 formed in the outer peripheral end portion 34 is smaller than that of a lower portion of the trimming surface 36. That is, the trimming surface 36 may be formed in a shape of a side surface of a substantially truncated cone. Specifically, an angle formed by the device surface 32 and the inclined trimming surface 36 is, for example, 70 to 90 degrees, and preferably about 80 degrees. Since the trimming surface 36 is formed to be inclined so that the diameter of the upper portion is reduced in this way, the chipping of the semiconductor device wafer 30 can be further reduced.

As described above, in the edge trimming step, the support angle of the blade-forming grinding wheel 40 (see FIG. 2) is adjusted on the basis of the accurate data of the shape of the groove 35 obtained by the imaging apparatus 45 (see FIG. 3), and the tip shape of the rotary blade 17 (see FIG. 2) is corrected. Thus, the tip shape of the rotary blade 17 is always maintained in a suitable inclined state, and highly accurate trimming processing is performed continuously and efficiently. That is, the trimming surface 36 inclined at a suitable angle is formed on the outer peripheral end portion 34 of the semiconductor device wafer 30.

Figure 7A:
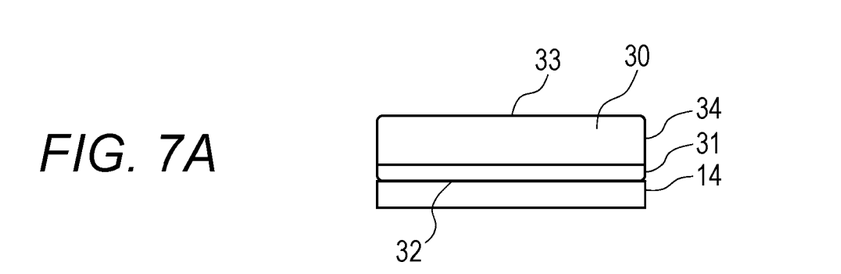
FIG. 7A is a diagram illustrating the state in which the semiconductor device wafer is prepared in the chucking step.
Figure 7B:
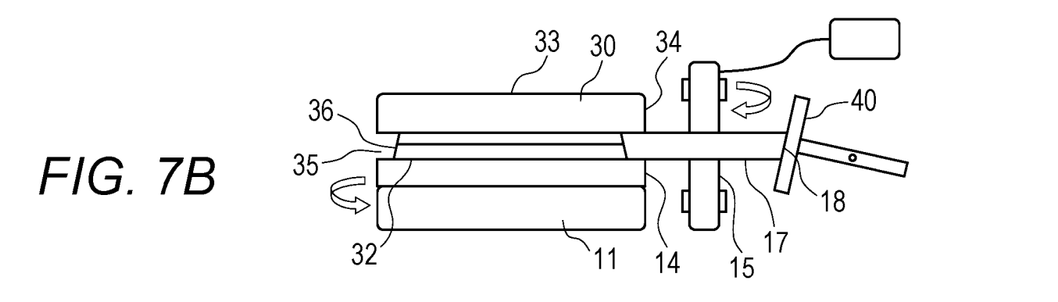
FIG. 7B is a diagram illustrating the state in which the trimming is performed in the edge trimming step.
Figure 7C:
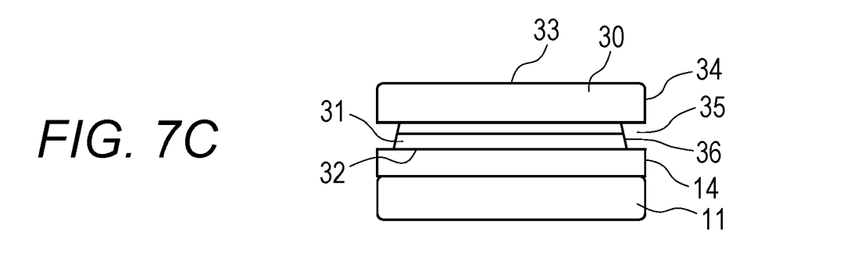
FIG. 7C is a diagram illustrating the state in which the edge trimming step is completed.
Figure 7D:
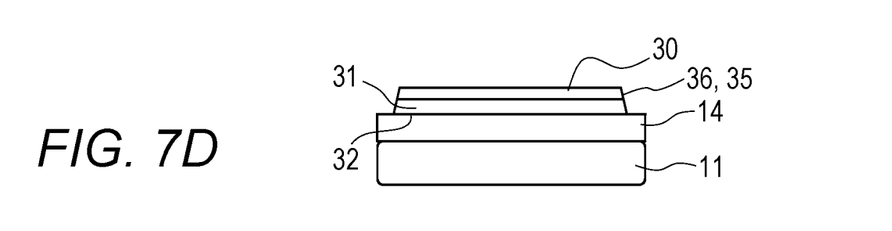
FIG. 7D is a diagram illustrating the state in which thinning is performed in the thinning step.

FIGS. 7A to 7D are diagrams illustrating another example of the method for manufacturing the semiconductor device. FIG. 7A is a diagram illustrating the state in which the semiconductor device wafer 30 is prepared in the chucking step, FIG. 7B is a diagram illustrating the state in which the trimming is performed in the edge trimming step, FIG. 7C is a diagram illustrating the state in which the edge trimming step is completed, and FIG. 7D is a diagram illustrating the state in which thinning is performed in the thinning step. Note that components having the same or similar operation or effect as those of the above-described embodiment are denoted by the same reference numerals.

As illustrated in FIG. 7A, in the chucking step, a protective tape 14 which is the BG tape is attached to the device surface 32 of the semiconductor device wafer 30. As the protective tape 14, for example, a UV tape E8180 manufactured by Lintec Corporation with a thickness of 180 μm is used.

Then, as illustrated in FIG. 7B, the semiconductor device wafer 30 is held by the vacuum chuck 11 via the protective tape 14 with the device surface 32 facing down.

Next, in the edge trimming step, the semiconductor device wafer 30 is trimmed by the horizontally rotating rotary blade 17 to which the ultrasonic waves are applied. As illustrated in FIG. 7C, the groove 35 having the trimming surface 36 is formed in the outer peripheral end portion 34 by trimming.

After the edge trimming step is performed, the thinning step of grinding the back surface 33 is performed. As a result, as illustrated in FIG. 7D, the highly flat and thinned semiconductor device wafer 30 having little thickness variation can be obtained.

As described above, according to the manufacturing method according to the present embodiment, after the chucking step is performed, the edge trimming step of forming the groove 35 in the outer peripheral end portion 34 of the semiconductor device wafer 30 is performed. Then, after the edge trimming step, the thinning step of thinning the semiconductor device wafer 30 is performed.

By these steps, the outer peripheral end portion 34 of the semiconductor device wafer 30 can be trimmed without being affected by various coating films such as a metal film or an insulating film formed on the surface of the device surface 32 of the semiconductor device wafer 30. In the edge trimming step, since the rotary blade 17 is horizontally rotated by the vertical spindle 15 to which the ultrasonic waves are applied, the trimming can be performed at high speed and with high accuracy.

Then, in the edge trimming step, the tip shape of the rotary blade 17 that is horizontally rotating is corrected to a suitable shape by the blade-forming grinding wheel 40. Thus, the stable trimming shape and trim surface properties can be obtained for the semiconductor device wafer 30, and the highly functional semiconductor device wafer 30 can be processed with a high yield. That is, the excellent productivity that cannot be obtained by the related art can be obtained. For example, the semiconductor device wafer 30 having an ultra thin thickness of 20 μm or less can be mass produced with a high yield.

Note that the present disclosure is not limited to the above embodiments, and various modifications can be made without departing from the gist of the present disclosure.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A method for manufacturing a semiconductor device, comprising:
    attracting a semiconductor device wafer by a chuck mechanism and rotating the semiconductor device wafer horizontally;
    rotating a rotary blade horizontally by a vertical spindle to which ultrasonic waves are applied;
    trimming an outer peripheral end portion of the semiconductor device wafer that is horizontally rotating by the rotary blade that is horizontally rotating, to form a groove in the outer peripheral end portion;
    correcting a tip shape of the rotary blade that is horizontally rotating by a blade-forming grinding wheel during the trimming; and
    grinding one main surface of the semiconductor device wafer that is horizontally rotating by a cup grinding wheel that is horizontally rotating after the trimming.

2. The method for manufacturing the semiconductor device according to claim 1, further comprising: during the trimming, imaging a shape of the groove; analyzing the shape of the groove based on captured image data; and correcting the tip shape of the rotary blade by the blade-forming grinding wheel based on the analyzed shape of the groove.

3. The method for manufacturing the semiconductor device according to claim 2, further comprising: during the trimming, projecting parallel light onto the groove; and analyzing the shape of the groove based on a shape of a shadow of the parallel light.

4. The method for manufacturing the semiconductor device according to claim 1, further comprising correcting the tip shape of the rotary blade while adjusting a support angle of the blade-forming grinding wheel.

5. An apparatus for manufacturing a semiconductor device, comprising:
   a chuck mechanism;
   a vertical spindle;
   an ultrasonic vibration device;
   a rotary blade; and
   a blade-forming grinding wheel, wherein
   the chuck mechanism is configured to attract a semiconductor device wafer and rotate the semiconductor device wafer horizontally,
   the vertical spindle is configured to rotate the rotary blade horizontally, the ultrasonic vibration device is configured to apply ultrasonic waves to the vertical spindle,
   the rotary blade is configured to, while being rotated horizontally by the vertical spindle to which the ultrasonic waves are applied, trim an outer peripheral end portion of the semiconductor device wafer, that is attracted by the chuck mechanism and rotates horizontally, to form a groove in the outer peripheral end portion, and
   the blade-forming grinding wheel is configured to correct a tip shape of the rotary blade by contacting a tip of the rotary blade that is horizontally rotating.

6. The apparatus for manufacturing the semiconductor device according to claim 5, further comprising
   an observation unit that images a shape of the groove and analyzes the shape of the groove based on captured image data, wherein
   the blade-forming grinding wheel corrects the tip shape of the rotary blade based on the analyzed shape of the groove.

\* \* \* \* \*